United States Patent
Farkas et al.

(10) Patent No.: US 12,366,601 B2
(45) Date of Patent: Jul. 22, 2025

(54) CHANNEL IMPEDANCE MEASUREMENT INSTRUMENT

(71) Applicant: DELL PRODUCTS L.P., Round Rock, TX (US)

(72) Inventors: Sandor Farkas, Round Rock, TX (US); Bhyrav Mutnury, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 195 days.

(21) Appl. No.: 18/345,141

(22) Filed: Jun. 30, 2023

(65) Prior Publication Data
US 2025/0004038 A1    Jan. 2, 2025

(51) Int. Cl.
    *G01R 31/28* (2006.01)
(52) U.S. Cl.
    CPC ..... *G01R 31/2813* (2013.01); *G01R 31/2818* (2013.01)
(58) Field of Classification Search
    CPC ............ G01R 31/2813; G01R 31/2818; G01R 31/282; G01R 31/2822; G01R 31/2853; G01R 31/2886; G01R 27/04; G01R 27/28
    See application file for complete search history.

(56) References Cited

U.S. PATENT DOCUMENTS

| | | | |
|---|---|---|---|
| 6,191,601 B1 | 2/2001 | Swart | |
| 7,340,703 B2 | 3/2008 | Hegazy et al. | |
| 2002/0040809 A1* | 4/2002 | Okubo | G01R 31/2812 174/255 |
| 2003/0061701 A1* | 4/2003 | Osaka | G01R 31/11 361/783 |
| 2009/0267628 A1* | 10/2009 | Takase | G01R 31/31905 324/763.01 |
| 2011/0187399 A1* | 8/2011 | Laquai | H01P 5/12 333/127 |

* cited by examiner

*Primary Examiner* — Thang X Le
(74) *Attorney, Agent, or Firm* — Larson Newman, LLP

(57) ABSTRACT

A test system is provided for determining that data channels on a printed circuit board (PCB) have a predetermined impedance level. Each channel in the PCB is terminated at the predetermined impedance level. The PCB has a receptacle for coupling a device to the channels. An instrument can be installed into the receptacle, and includes connections to each of the channels, and a connector that is coupled to the connections by a channel splitter network. A test device is coupled to the connector and provides a test signal to the connector, receives a return signal from the connector, and determines that at least one of the channels does not have the predetermined impedance based upon the return signal.

19 Claims, 4 Drawing Sheets

CHANNEL IMPEDANCE MEASUREMENT INSTRUMENT

FIELD OF THE DISCLOSURE

This disclosure generally relates to information handling systems, and more particularly relates to a channel impedance measurement.

BACKGROUND

As the value and use of information continues to increase, individuals and businesses seek additional ways to process and store information. One option is an information handling system. An information handling system generally processes, compiles, stores, and/or communicates information or data for business, personal, or other purposes. Because technology and information handling needs and requirements may vary between different applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, reservations, enterprise data storage, or global communications. In addition, information handling systems may include a variety of hardware and software resources that may be configured to process, store, and communicate information and may include one or more computer systems, data storage systems, and networking systems.

SUMMARY

A test system may be provided for determining that data channels on a printed circuit board (PCB) have a predetermined impedance level. The test system may include the PCB, an instrument, and a test device. Each channel in the PCB may be is terminated at the predetermined impedance level. The PCB may have a receptacle for coupling a device to the channels. The instrument can be installed into the receptacle, and may include connections to each of the channels, and a connector that is coupled to the connections by a channel splitter network. The test device may be coupled to the connector, and may be configured to provide a test signal to the connector, to receive a return signal from the connector, and to determine that at least one of the channels does not have the predetermined impedance based upon the return signal

BRIEF DESCRIPTION OF THE DRAWINGS

It will be appreciated that for simplicity and clarity of illustration, elements illustrated in the Figures have not necessarily been drawn to scale. For example, the dimensions of some of the elements are exaggerated relative to other elements. Embodiments incorporating teachings of the present disclosure are shown and described with respect to the drawings presented herein, in which.

The use of the same reference symbols in different drawings indicates similar or identical items.

DETAILED DESCRIPTION OF DRAWINGS

The following description in combination with the Figures is provided to assist in understanding the teachings disclosed herein. The following discussion will focus on specific implementations and embodiments of the teachings. This focus is provided to assist in describing the teachings, and should not be interpreted as a limitation on the scope or applicability of the teachings. However, other teachings can certainly be used in this application. The teachings can also be used in other applications, and with several different types of architectures, such as distributed computing architectures, client/server architectures, or middleware server architectures and associated resources.

Figure 1:
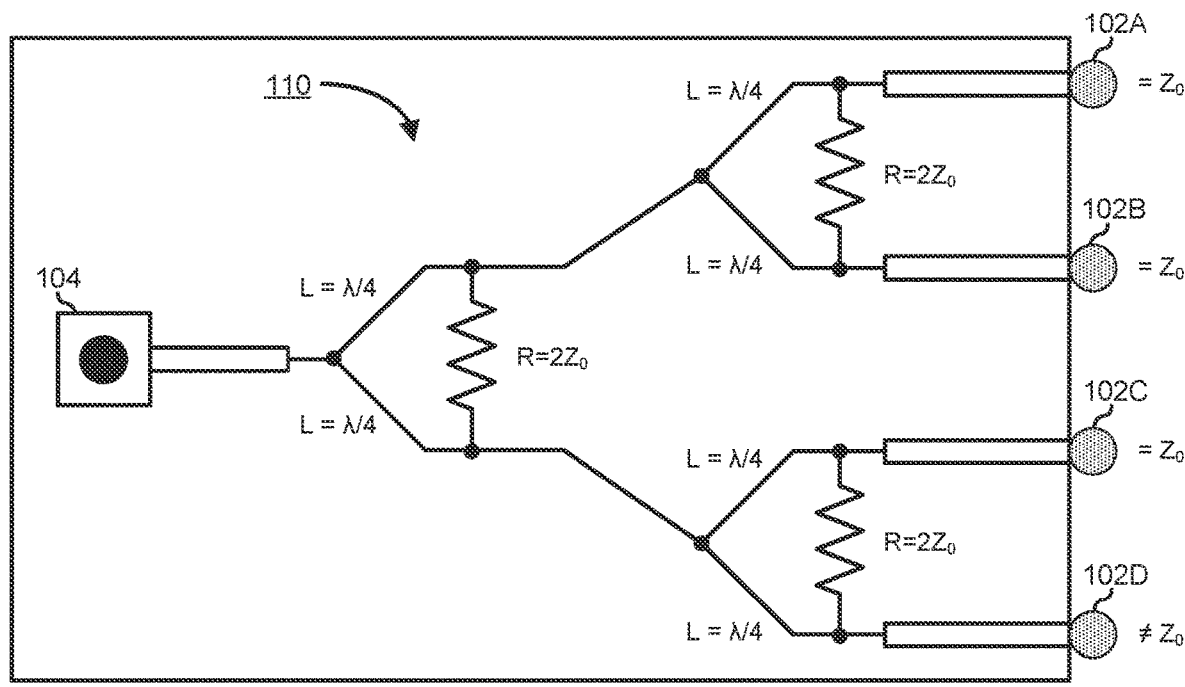
FIG. 1 is a diagram of a channel impedance measurement instrument according to an embodiment of the current disclosure.

FIG. 1 illustrates a channel impedance measurement instrument 100 including channel connections 102A-102D coupled to a test device connector 104 by a channel splitter network 110. Impedance measurement instrument 100 provides a quality check of the channel impedance of multiple signal channels on an information handling system. In particular, instrument 100 is provided for installation into a socket, connector, or other removable device receptacle. The particular socket, connector, or receptacle will be understand as being mechanically affixed to a printed circuit board (PCB). The socket, connector, or receptacle will be further understood to include contacts that are electrically connected to the PCB to provide interconnections between a removable device (i.e., a socketed integrated circuit (IC) device, an add-in card device or other connectorized device, a signal cable, or the like), and other devices that are connected to the contacts by signal traces instantiated within the PCB. Thus instrument 100 will be understood to be installable into the socket, connector, or receptacle in a form factor that is at least partially similar to the particular device that is intended to be installed into the socket, connector, or receptacle.

In this regard, connections 102A-102D are each located so as to interface with a particular high-speed data communication interface signal between the removable device and another device. For example, if the removable device is a socketable device, such as a flip-chip pin grid array (FC-PGA) device, a land grid array (LGA) device, or the like, then instrument 100 will have a form factor similar to the removable device, have connections 102A-102D for high-speed data communication interface signals similar to the removable device (i.e., pins for a FC-PGA device, pads for a LGA device, etc.) and that are located in the same location as their associated signals. Similarly, if the removable device is a connectorized device, such as an add-in card, a connectorized device, or the like, then instrument 100 will have a form factor similar to the removable device, have connections 102A-102D for high-speed data communication interface signals similar to the removable device (i.e., plated fingers for ab add-in card device, pin/socket connectors for a connectorized device, etc.) and that are located in the same location as their associated signals. As used hereinafter, the element into which instrument 100 is installed will be referred to as a receptacle.

Instrument 100 is a passive slug device that is installed into the receptacle, but that is not expected to provide data signaling (i.e., no data signal inputs or outputs). Test device connector 104 represents a single-point connection to which an external test setup is connected to send test signals to connections 102A-102D, and to receive test result data from the connections. Here, it will be understood that the high-speed data communication interface signals associated with connections 102A-102D are of a common type, and in particular, are designed and implemented to a common channel impedance ($Z_O$) within the PCB to which instrument 100 is installed. More particularly, it will be understood that the other devices on the PCB that are connected to the high-speed data communication interface signals are terminated with the common channel impedance ($Z_O$). Channel splitter network 110 operates to equally split inputs received at test device connector 104 to connections 102A-102D. It will be understood that instrument 100 is designed and implemented to the specific channel impedance ($Z_O$). Here, because the single test device connector 104 is split to four (4) connections 102A-102D, channel splitter network 110 is illustrated as a first bank with a single (1) 2:1 splitter terminated by a resistor with a value of $2*Z0$, with outputs to a second bank with two (2) 2:1 splitters, each terminated by a resistor with a value of $2*Z_O$, the outputs of which each are connected to one of the connections.

It will be understood that the ideal channel perfectly receives, or terminates, all of the transmitted signal energy. Thus, a waveform provided on test device input 104 will be divided equally to each one of connections 102A-102D with minimal reflections. Further, the other devices that are connected to connections 102A-102D may be assumed to be correctly terminated at the common channel impedance ($Z_O$). However, due to the vagaries of PCB manufacturing, design layout quality, or the like, a particular high-speed data communication channel may have significant variances from the expected common channel impedance ($Z_O$). For example, actual channel impedance variances may exceed 15% from the expected common channel impedance ($Z_O$). In such cases, the variances in the channel impedance of the signal channels associated with connections 102A-102D will be exhibited at test device connector 104 as a reflection of the transmitted test signal. In this way, instrument 100 allows for a gross level pass/fail determination on the quality of the signal channels on the particular PCB into which the instrument is installed. Here, the specific one of four signal channels that cause the reflected signal may not be readily identifiable due to the topology of channel splitter network 100. However, the gross level pass/fail determination may be sufficient to ensure higher product quality by excluding from the product stream those PCBs that exhibit excessive channel impedance excursions.

It will be understood that other numbers of connections may be provided by an instrument similar to instrument 100. In particular, an instrument with a number (N) of banks of splitters will be understood to provide connections for $2^N$ signals. Moreover, more than one test circuit (i.e., the combination of connections 102, test device connector 104, and channel splitter network 110) may be provided on a common instrument. In a first case, each of the various test circuits may be for a common type of high-speed data communication interface signal with a first common channel impedance ($Z_O$), in order to lessen the input power from a test device on each circuit. In a second case, one or more of the various test circuits may be provided for testing a different type of high-speed data communication interface channels with different characteristic impedances ($Z_{O1}$, $Z_{O2}$, etc.), as needed or desired. Further, while channel splitter network 110 is illustrated as being formed with 2:1 signal splitters, this is not necessarily so, and other split ratios may be utilized as needed or desired, such as 3:1 signal splitters, 4:1 signal splitters, or the like. Further, a channel splitter network may be fabricated utilizing different splitter ratios in different groupings. For example, a channel splitter network may have a first bank with a single 2:1 signal splitter, followed by a second bank with two (2) 3:1 signal splitter, making a total of six (6) connections. Further, more than two (2) banks of signal splitters may be utilized as needed or desired.

It will be further understood that instrument 100 may be designed, or tuned, to measure the signal channel impedances at a particular frequency of interest, such as at an expected operating frequency for the high-speed data communication interface. For example, instrument 100 may be optimized to test a high-speed data communication interface that is expected to operate at 10 giga-Hertz (GHz). As such, the lengths of the elements of the signal splitters may be designed with a length equal to a quarter-wavelength ($L=\lambda/4$) at the expected operating frequency. The details of signal splitter design is known in the art and will not be described further, except as may be needed to describe the current embodiments.

Figure 2A:
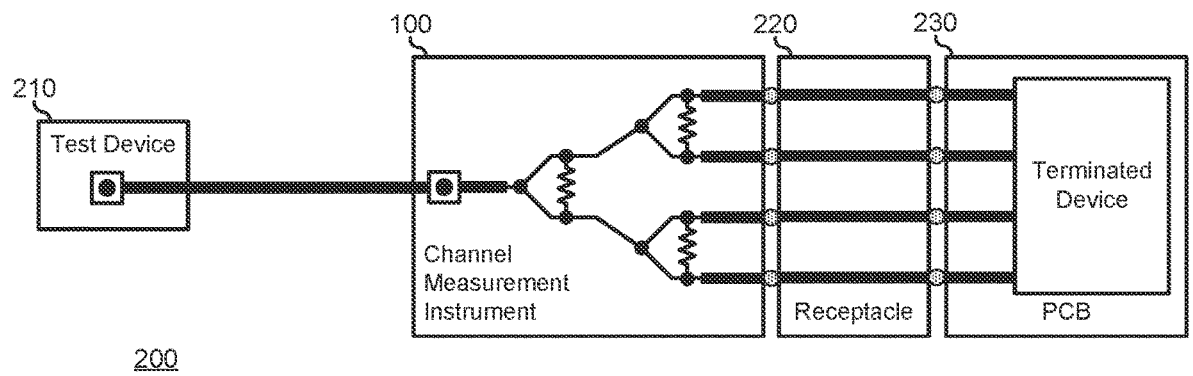
FIGS. 2A-2C are block diagrams of examples of the use of the channel impedance measurement instrument of FIG. 1 according to various embodiments of the current disclosure.
Figure 2B:
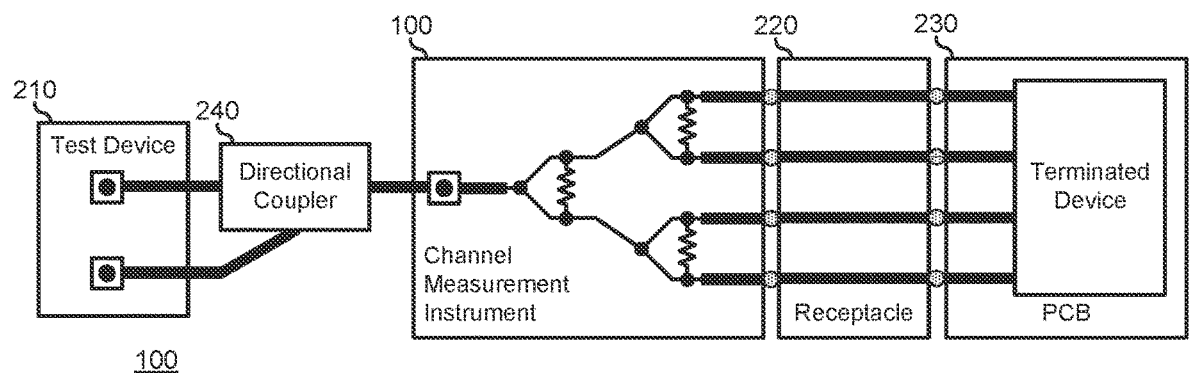
Figure 2C:
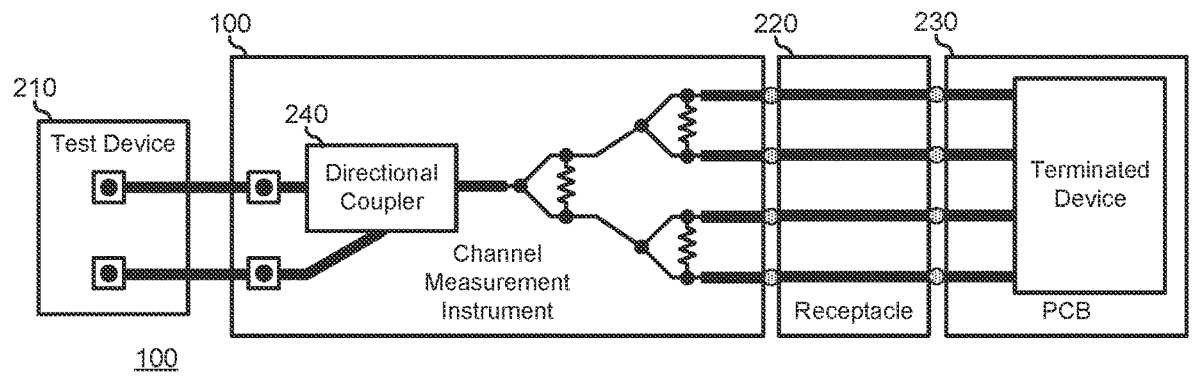

FIGS. 2A-2C illustrate the use of instrument 100 in various system test set-ups. FIG. 2A illustrates where a test device 210 connected to the test device connector of instrument 100. Instrument 100 is installed into a matching receptacle 220 that is mechanically and electrically connected to a PCB 230. PCB 230 includes a terminated device that includes channel terminations for each of the signal channels at the common channel impedance ($Z_O$). Note that test device 210 includes a single input/output connection. In this case, it will be understood that test device 210 includes sophisticated signal processing equipment that permits the simultaneous transmission of the test signal and the receipt of the resulting signal from instrument 100.

FIG. 2B illustrates a system test set-up similar to the system test set-up illustrated in FIG. 2A, except here, rather than test device 210 providing a single test connector, the test device includes an output test connector and an input test connector, and the system test set-up includes a directional coupler 240 connected to the output test connector, the input test connector, and the test device connector of instrument 100. Here, the output test signal is provided on the output test connector, and is forwarded to instrument 100 by directional coupler 240. Then the reflected signal is diverted by directional coupler 240 to the input test connector of test device 210. FIG. 2C is similar to FIG. 2B, except that directional coupler 240 is incorporated onto instrument 100. Note that each of the set-ups shown in FIGS. 2A-2C have the same inability to detect which one of the signal channels is the "bad" signal channel, as described above.

Figure 3:
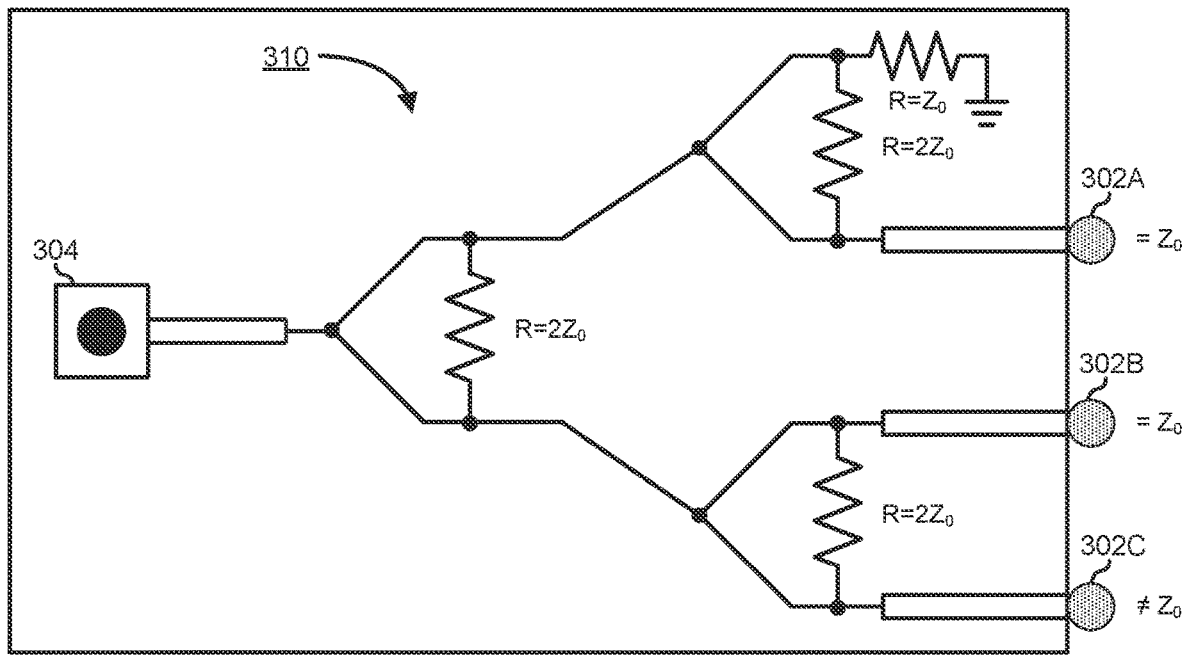
FIG. 3 is a diagram of a channel impedance measurement instrument according to another embodiment of the current disclosure.

FIG. 3 illustrates a channel impedance measurement instrument 300 similar to instrument 100 and including channel connections 302A-302C coupled to a test device connector 304 by a channel splitter network 310. Test device connector 304 represents a single-point connection to which an external test setup is connected to send test signals to connections 302A-302C, and to receive test result data from the connections. Here, it will be understood that the high-speed data communication interface signals associated with connections 302A-302C are of a common type, and in particular, are designed and implemented to a common channel impedance ($Z_O$) within the PCB to which instrument 300 is installed, as further described with respect to instrument 100 above. However, here channel splitter network 310 operates to equally split inputs received at test device connector 304 to connections 302A-302C and to a dummy node that is terminated with the common channel impedance ($Z_O$). Here, the three (3) signal channels associated with connections 302A-302C, are positively verified against the common channel impedance ($Z_O$) provided by the dummy node.

FIG. 3 illustrates a channel impedance measurement instrument 300 similar to instrument 100 and including channel connections 302A-302C coupled to a test device connector 304 by a channel splitter network 310. Test device connector 304 represents a single-point connection to which an external test setup is connected to send test signals to connections 302A-302C, and to receive test result data from the connections. Here, it will be understood that the high-speed data communication interface signals associated with connections 302A-302C are of a common type, and in particular, are designed and implemented to a common channel impedance ($Z_O$) within the PCB to which instrument 300 is installed, as further described with respect to instrument 100 above. However, here channel splitter network 310 operates to equally split inputs received at test device connector 304 to connections 302A-302C and to a dummy node that is terminated with the common channel impedance ($Z_O$). Here, the three (3) signal channels associated with connections 302A-302C, are positively verified against the common channel impedance ($Z_O$) provided by the dummy node.

Figure 4:
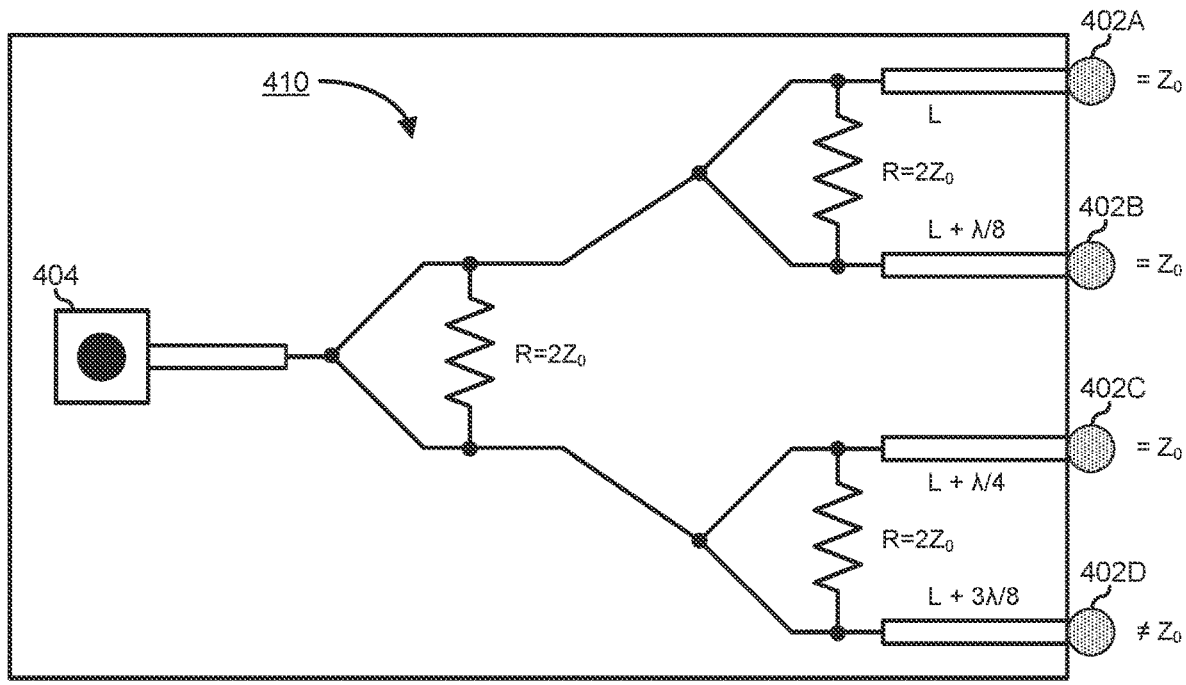
FIG. 4 is a diagram of a channel impedance measurement instrument according to another embodiment of the current disclosure.

FIG. 4 illustrates a channel impedance measurement instrument 400 similar to instrument 100 and including channel connections 402A-402D coupled to a test device connector 404 by a channel splitter network 410. Test device connector 404 represents a single-point connection to which an external test setup is connected to send test signals to connections 402A-402D, and to receive test result data from the connections. Here, it will be understood that the high-speed data communication interface signals associated with connections 402A-402D are of a common type, and in particular, are designed and implemented to a common channel impedance ($Z_O$) within the PCB to which instrument 400 is installed, as further described with respect to instrument 100 above. However, here the lengths of the traces between the second bank channel splitters and the associated one of connections 402A-402D are tuned. It will be understood that in some cases, it may be advantageous to provide test signals to the associated signal channels with spread out edges. However, providing such spread out edges from test device connector 404 is not readily achievable, the test device connector being a single (1) input. Thus, by tuning the lengths of the traces, the returning test signals become time-shifted, thereby permitting a determination as to which one of the signal channels is out of spec. Further, the tuned lengths provide a higher effective edge rate for the test signal, permitting targeted testing, for example, for power distribution testing.

In this embodiment, the circuit trace to connection 402A has a particular length (1=L), the circuit trace to connection 402B has a particular length that is longer than the particular length by $\frac{1}{8}\lambda$ (1=L+$\frac{1}{8}\lambda$), the circuit trace to connection 402C has a particular length that is longer than the particular length by $\frac{1}{4}\lambda$ (1=L+$\frac{1}{4}\lambda$), and the circuit trace to connection 402D has a particular length that is longer than the particular length by $\frac{3}{8}\lambda$ (1=L+$\frac{3}{8}\lambda$), where $\lambda$ is the wavelength of the test signal. The wavelength ($\lambda$) will be understood to be the transmission speed(s) divided by the frequency (f), hence $\lambda$=s/f. Generally, where the number of channels (N) differs from the four (4) channels illustrated herein, an ideal phase shift can be determined as $\lambda$/4N degrees, evenly divided within a half period.

Generally with either instrument 100, instrument 300, or instrument 400, a typical method for measuring the channel impedance will be to use a test device, such as a vector network analyzer (VNA), or, with the inclusion of a directional coupler, such as directional coupler 280, above, a scalar network analyzer (SNA), a spectrum analyzer (SA), or the like and send a wideband sweep test signal. For example, where the instrument is designed for 10 giga-Hertz (GHz) operation, a test signal can include a wideband sweep centered at 10 GHz with a +/−10% bandwidth. The observed return signal may be utilized to determine a pass/fail criteria. If the observed return signal has a smooth curve, for example, on a swept frequency domain path (FDR) or on a time-domain path (TDR), or exhibits a constant amplitude on an oscilloscope, the board may be understood to be a passing board, while a return signal that exhibits a ripple will be understood to be a failing board.

Figure 5:
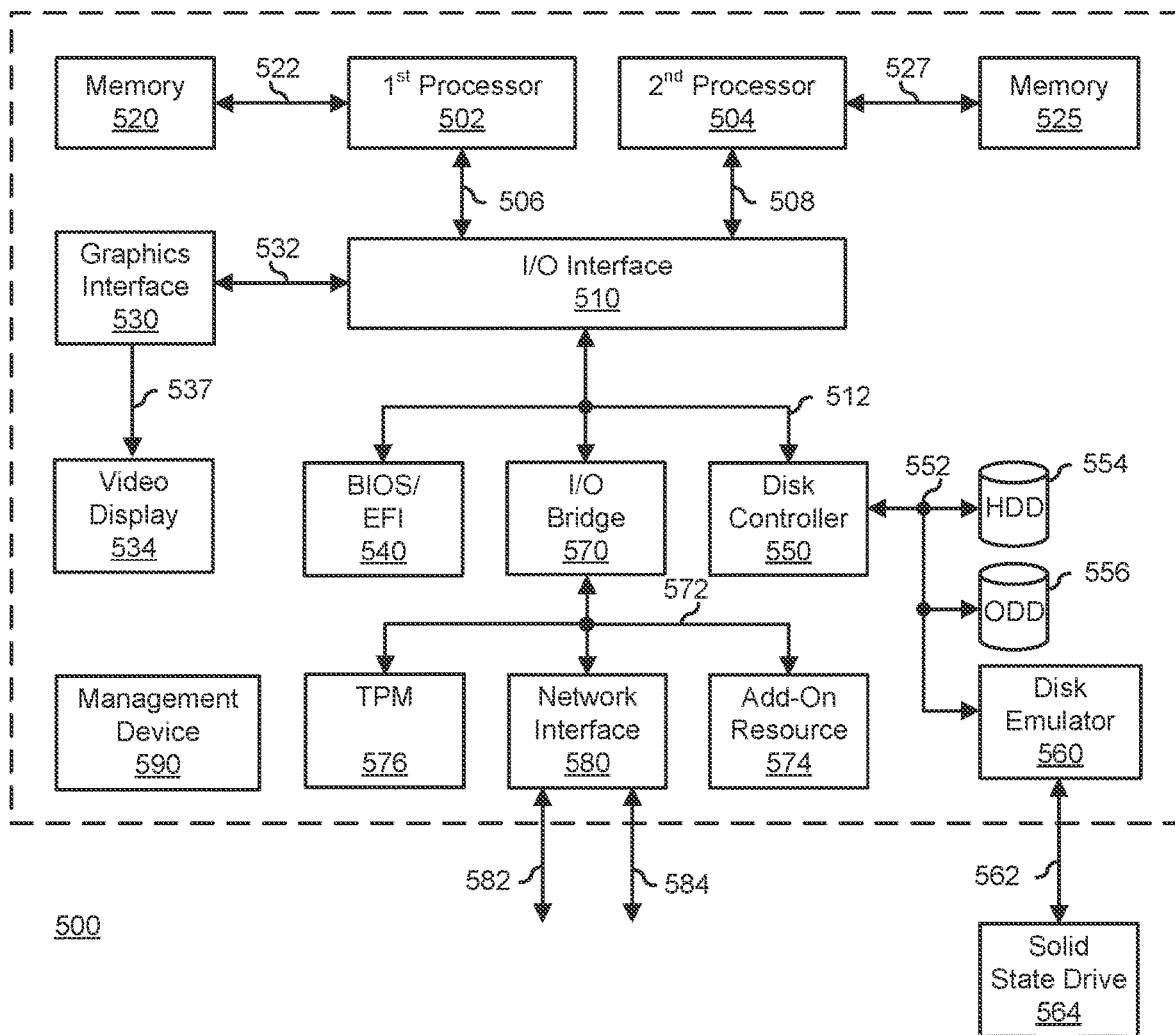
FIG. 5 is a block diagram illustrating a generalized information handling system according to another embodiment of the present disclosure.

FIG. 5 illustrates a generalized embodiment of an information handling system 500. For purpose of this disclosure an information handling system can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, information handling system 500 can be a personal computer, a laptop computer, a smart phone, a tablet device or other consumer electronic device, a network server, a network storage device, a switch router or other network communication device, or any other suitable device and may vary in size, shape, performance, functionality, and price. Further, information handling system 500 can include processing resources for executing machine-executable code, such as a central processing unit (CPU), a programmable logic array (PLA), an embedded device such as a System-on-a-Chip (SoC), or other control logic hardware. Information handling system 500 can also include one or more computer-readable medium for storing machine-executable code, such as software or data. Additional components of information handling system 500 can include one or more storage devices that can store machine-executable code, one or more communications ports for communicating with external devices, and various input and output (I/O) devices, such as a keyboard, a mouse, and a video display. Information handling system 500 can also include one or more buses operable to transmit information between the various hardware components.

Information handling system 500 can include devices or modules that embody one or more of the devices or modules described below, and operates to perform one or more of the methods described below. Information handling system 500 includes a processors 502 and 504, an input/output (I/O) interface 510, memories 520 and 525, a graphics interface 530, a basic input and output system/universal extensible firmware interface (BIOS/UEFI) module 540, a disk controller 550, a hard disk drive (HDD) 554, an optical disk drive (ODD) 556, a disk emulator 560 connected to an external solid state drive (SSD) 562, an I/O bridge 570, one or more add-on resources 574, a trusted platform module (TPM) 576, a network interface 580, a management device 590, and a power supply 595. Processors 502 and 504, I/O interface 510, memory 520, graphics interface 530, BIOS/ UEFI module 540, disk controller 550, HDD 554, ODD 556, disk emulator 560, SSD 562, I/O bridge 570, add-on resources 574, TPM 576, and network interface 580 operate together to provide a host environment of information handling system 500 that operates to provide the data processing functionality of the information handling system. The host environment operates to execute machine-executable code, including platform BIOS/UEFI code, device firmware, operating system code, applications, programs, and the like, to perform the data processing tasks associated with information handling system 500.

In the host environment, processor 502 is connected to I/O interface 510 via processor interface 506, and processor 504 is connected to the I/O interface via processor interface 508. Memory 520 is connected to processor 502 via a memory interface 522. Memory 525 is connected to processor 504 via a memory interface 527. Graphics interface 530 is connected to I/O interface 510 via a graphics interface 532, and provides a video display output 536 to a video display 534. In a particular embodiment, information handling system 500 includes separate memories that are dedicated to each of processors 502 and 504 via separate memory interfaces. An example of memories 520 and 530 include random access memory (RAM) such as static RAM (SRAM), dynamic RAM (DRAM), non-volatile RAM (NV-RAM), or the like, read only memory (ROM), another type of memory, or a combination thereof.

BIOS/UEFI module 540, disk controller 550, and I/O bridge 570 are connected to I/O interface 510 via an I/O channel 512. An example of I/O channel 512 includes a Peripheral Component Interconnect (PCI) interface, a PCI-Extended (PCI-X) interface, a high-speed PCI-Express (PCIe) interface, another industry standard or proprietary communication interface, or a combination thereof. I/O interface 510 can also include one or more other I/O interfaces, including an Industry Standard Architecture (ISA) interface, a Small Computer Serial Interface (SCSI) interface, an Inter-Integrated Circuit (I²C) interface, a System Packet Interface (SPI), a Universal Serial Bus (USB), another interface, or a combination thereof. BIOS/UEFI module 540 includes BIOS/UEFI code operable to detect resources within information handling system 500, to provide drivers for the resources, initialize the resources, and access the resources. BIOS/UEFI module 540 includes code that operates to detect resources within information handling system 500, to provide drivers for the resources, to initialize the resources, and to access the resources.

Disk controller 550 includes a disk interface 552 that connects the disk controller to HDD 554, to ODD 556, and to disk emulator 560. An example of disk interface 552 includes an Integrated Drive Electronics (IDE) interface, an Advanced Technology Attachment (ATA) such as a parallel ATA (PATA) interface or a serial ATA (SATA) interface, a SCSI interface, a USB interface, a proprietary interface, or a combination thereof. Disk emulator 560 permits SSD 564 to be connected to information handling system 500 via an external interface 562. An example of external interface 562 includes a USB interface, an IEEE 2394 (Firewire) interface, a proprietary interface, or a combination thereof. Alternatively, solid-state drive 564 can be disposed within information handling system 500.

I/O bridge 570 includes a peripheral interface 572 that connects the I/O bridge to add-on resource 574, to TPM 576, and to network interface 580. Peripheral interface 572 can be the same type of interface as I/O channel 512, or can be a different type of interface. As such, I/O bridge 570 extends the capacity of I/O channel 512 when peripheral interface 572 and the I/O channel are of the same type, and the I/O bridge translates information from a format suitable to the I/O channel to a format suitable to the peripheral channel 572 when they are of a different type. Add-on resource 574 can include a data storage system, an additional graphics interface, a network interface card (NIC), a sound/video processing card, another add-on resource, or a combination thereof. Add-on resource 574 can be on a main circuit board, on separate circuit board or add-in card disposed within information handling system 500, a device that is external to the information handling system, or a combination thereof.

Network interface 580 represents a NIC disposed within information handling system 500, on a main circuit board of the information handling system, integrated onto another component such as I/O interface 510, in another suitable location, or a combination thereof. Network interface device 580 includes network channels 582 and 584 that provide interfaces to devices that are external to information handling system 500. In a particular embodiment, network channels 582 and 584 are of a different type than peripheral channel 572 and network interface 580 translates information from a format suitable to the peripheral channel to a format suitable to external devices. An example of network channels 582 and 584 includes InfiniBand channels, Fibre Channel channels, Gigabit Ethernet channels, proprietary channel architectures, or a combination thereof. Network channels 582 and 584 can be connected to external network resources (not illustrated). The network resource can include another information handling system, a data storage system, another network, a grid management system, another suitable resource, or a combination thereof.

Management device 590 represents one or more processing devices, such as a dedicated baseboard management controller (BMC) System-on-a-Chip (SoC) device, one or more associated memory devices, one or more network interface devices, a complex programmable logic device (CPLD), and the like, that operate together to provide the management environment for information handling system 500. In particular, management device 590 is connected to various components of the host environment via various internal communication interfaces, such as a Low Pin Count (LPC) interface, an Inter-Integrated-Circuit (I2C) interface, a PCIe interface, or the like, to provide an out-of-band (OOB) mechanism to retrieve information related to the operation of the host environment, to provide BIOS/UEFI or system firmware updates, to manage non-processing components of information handling system 500, such as system cooling fans and power supplies. Management device 590 can include a network connection to an external management system, and the management device can communicate with the management system to report status information for information handling system 500, to receive BIOS/UEFI or system firmware updates, or to perform other task for managing and controlling the operation of information handling system 500. Management device 590 can operate off of a separate power plane from the components of the host environment so that the management device receives power to manage information handling system 500 when the information handling system is otherwise shut down. An example of management device 590 include a commercially available BMC product or other device that operates in accordance with an Intelligent Platform Management Initiative (IPMI) specification, a Web Services Management (WSMan) interface, a Redfish Application Programming Interface (API), another Distributed Management Task Force (DMTF), or other management standard, and can include an Integrated Dell Remote Access Controller (iDRAC), an Embedded Controller (EC), or the like. Management device 590 may further include associated memory devices, logic devices, security devices, or the like, as needed or desired.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

The above-disclosed subject matter is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A test system for determining that a plurality of data channels on a printed circuit board (PCB) have a predetermined impedance level, wherein each channel is terminated at the predetermined impedance level, the PCB having a receptacle for coupling a device to the channels, the test system comprising:
   an instrument configured to be installed into the receptacle, the instrument including connections to each of the channels, and a first connector, wherein the connector is coupled to the connections by a channel splitter network; and
   a test device coupled to the first connector, the test device configured to provide a test signal to the connector, to receive a return signal from the connector, and to determine that at least one of the channels does not have the predetermined impedance based upon the return signal.

2. The test system of claim 1, wherein the channel splitter network includes a symmetrical channel splitter.

3. The test system of claim 2, wherein the symmetrical channel splitter splits an input from the first connector into two symmetrical channels.

4. The test system of claim 3, wherein the symmetrical channels are terminated with twice the predetermined impedance level.

5. The test system of claim 2, wherein the symmetrical channel splitter splits an input from the first connector into three symmetrical channels.

6. The test system of claim 1, further comprising a directional coupler.

7. The test system of claim 6, wherein the directional coupler is coupled at an output port to a test output of the test device, is coupled at an input port to a test input of the test device, and is coupled at a test signal port to the first connector.

8. The test system of claim 6, wherein the directional coupler is included in the instrument.

9. The test system of claim 8, wherein the coupler is coupled at an output port to the first connector, is coupled at an input port to a second connector of the instrument, and is coupled at a test signal port to the channel splitter network.

10. The test instrument of claim 1, the at least one channel is determined to not have the predetermined impedance when the return signal exhibits a ripple.

11. A method for determining that a plurality of data channels on a printed circuit board (PCB) have a predetermined impedance level, the method comprising:
    terminating each channel at the predetermined impedance level;
    providing, on the PCB, a receptacle for coupling a device to the channels;
    installing an instrument into the receptacle, the instrument including connections to each of the channels, and a first connector;
    coupling the connector to the connections by a channel splitter network;
    coupling a test device to the first connector;
    providing, by the test device, a test signal to the connector;
    receiving, by the test device, a return signal from the connector; and
    determining that at least one of the channels does not have the predetermined impedance based upon the return signal.

12. The method of claim 11, wherein the channel splitter network includes a symmetrical channel splitter.

13. The method of claim 12, wherein the symmetrical channel splitter splits an input from the first connector into two symmetrical channels.

14. The method of claim 13, wherein the symmetrical channels are terminated with twice the predetermined impedance level.

15. The method of claim 12, wherein the symmetrical channel splitter splits an input from the first connector into three symmetrical channels.

16. The method of claim 11, further comprising:
    coupling a directional coupler at an output port to a test output of the test device;
    coupling the directional coupler at an input port to a test input of the test device; and
    coupling the directional coupler at a test signal port to the first connector.

17. The method of claim 11, further comprising providing, on the instrument, a directional coupler.

18. The method of claim 17, further comprising:
    coupling an output port of the directional coupler to the first connector;
    coupling an input port of the directional coupler to a test input of the test device; and
    coupling a test signal port of the directional coupler to the channel splitter network.

19. The method of claim 11, further comprising determining that the at least one channel does not have the predetermined impedance when the return signal exhibits a ripple.

* * * * *